(12) United States Patent
Geuther et al.

(10) Patent No.: US 9,541,590 B2
(45) Date of Patent: Jan. 10, 2017

(54) CIRCUIT ARRANGEMENT AND METHOD FOR DETECTING A CAPACITANCE AND/OR A CHANGE IN A CAPACITANCE OF A CAPACITIVE COMPONENT

(71) Applicant: Brose Fahrzeugteile GmbH & Co. Kommanditgesellschaft, Hallstadt, Hallstadt (DE)

(72) Inventors: Udo Geuther, Bamberg (DE); Ralf Daiminger, Bamberg (DE); Detlef Russ, Ebersdorf (DE)

(73) Assignee: Brose Fahrzeugteile GmbH & Co. Kommanditgesellschaft, Hallstadt, Hallstadt (DE)

( * ) Notice: Subject to any disclaimer, the term of this patent is extended or adjusted under 35 U.S.C. 154(b) by 0 days.

(21) Appl. No.: 14/614,240

(22) Filed: Feb. 4, 2015

(65) Prior Publication Data

US 2015/0219703 A1    Aug. 6, 2015

(30) Foreign Application Priority Data

Feb. 6, 2014  (DE) .................. 10 2014 202 216
Feb. 6, 2014  (DE) .................... 20 2014 100 536 U

(51) Int. Cl.
  *G01R 27/26*   (2006.01)
  *G01M 17/00*   (2006.01)
  *H03K 17/955*  (2006.01)

(52) U.S. Cl.
  CPC .......... *G01R 27/2605* (2013.01); *G01M 17/00* (2013.01); *H03K 17/955* (2013.01);
  (Continued)

(58) Field of Classification Search
  CPC ......................... G01R 27/2605; G01M 17/00
  (Continued)

(56) References Cited

U.S. PATENT DOCUMENTS 3,896,374 A    7/1975 Delafon
5,406,137 A    4/1995 Scheler et al.
(Continued)

FOREIGN PATENT DOCUMENTS

DE          102 58 417 B3    8/2004
DE    10 2006 029 120 A1   12/2007
(Continued)

OTHER PUBLICATIONS

JPO Notification of Reasons for Rejection for JP Application No. 2015-020896 dated Jan. 26, 2016 with English translation, 6 pages.
(Continued)

*Primary Examiner* — Billy Lactaoen
(74) *Attorney, Agent, or Firm* — Lewis Roca Rothgerber Christie LLP

(57) ABSTRACT

The present invention relates to a circuit arrangement for detecting a capacitance of a capacitive component and/or a change in the capacitance of a capacitive component, which circuit arrangement comprises, inter alia a monostable flip-flop controllable by a control signal and having at least two inputs and one output, wherein a first input of the flipflop is provided for the control signal, and a second input is connected to a capacitive component. The circuit arrangement further comprises a conversion device, which is connected to the output of the monostable flipflop, and an evaluation unit, which is connected to the conversion device in order to evaluate the signal voltage and from this to generate at least one detection value, which indicates the capacitance and/or a change in the capacitance of the capacitive component.

11 Claims, 3 Drawing Sheets

(52) U.S. Cl.
CPC ............ *H03K 2217/96071* (2013.01); *H03K 2217/960715* (2013.01)

(58) Field of Classification Search
USPC ....................................................... 324/686
See application file for complete search history.

(56) References Cited

U.S. PATENT DOCUMENTS

| | | | |
|---|---|---|---|
| 7,652,487 B2 | 1/2010 | Schulz et al. | |
| 2008/0012581 A1 | 1/2008 | Schulz et al. | |
| 2012/0268144 A1* | 10/2012 | Ahn .................... | G06F 3/0416 324/679 |
| 2013/0234828 A1 | 9/2013 | Holzberg et al. | |

FOREIGN PATENT DOCUMENTS

| | | | | |
|---|---|---|---|---|
| DE | 10201049400 A1 * | 4/2012 | ............ | B60R 25/01 |
| JP | 2012-227906 A | 11/2012 | | |
| JP | 2014-500414 A | 1/2014 | | |

OTHER PUBLICATIONS

Korean Office action for Application No. 10-2015-0018689 dated Feb. 15, 2016 with English translation, 13 pages.
Japanese Office action dated Aug. 23, 2016 issued in corresponding JP Application No. 2015-020896, with English translation, 4 pages.

* cited by examiner

CIRCUIT ARRANGEMENT AND METHOD FOR DETECTING A CAPACITANCE AND/OR A CHANGE IN A CAPACITANCE OF A CAPACITIVE COMPONENT

CROSS-REFERENCE TO RELATED APPLICATION

This application claims priority to German Patent Application No. 10 2014 202 216.9 filed on Feb. 6, 2014 and to German Utility Model Application No. 20 2014 100 536.6 filed on Feb. 6, 2014, the entirety of both of which is incorporated by reference herein.

BACKGROUND

The present invention relates to a circuit arrangement and a method for detecting a capacitance of a capacitive component and/or a change in the capacitance of a capacitive component.

A circuit arrangement of the generic type is known from DE 10 2006 029 120 A1. In the circuit arrangement disclosed in said document, a control unit for controlling a monostable flipflop is provided, which is connected to the capacitive component, for example a sensor electrode or an electrode arrangement comprising a response electrode and a reference electrode. The control unit is connected to a first input of the monostable flipflop in order to transmit control signals to the monostable flipflop, and the capacitive component is connected to a second input of the monostable flipflop. An output signal is generated by a control signal at an output of the monostable flipflop, the duration of said output signal being dependent on the capacitance of the capacitive component. Such an output signal is converted into a signal voltage via a conversion device, the course of said signal voltage being proportional to the duration of the output signal. The signal voltage obtained is thus likewise proportional to the capacitance of the capacitive component or a change in capacitance, with the result that it is possible to draw a conclusion in respect of the capacitance or the change in capacitance on the basis of the signal voltage. The signal voltage is correspondingly evaluated by an evaluation unit in order to generate from this a detection value which indicates the present capacitance and/or a change in the capacitance of the capacitive component.

Such a circuit arrangement is usable, for example, for an adjusting device for a closing element of a vehicle which is adjustable, actuated by external force, for example for a tailgate or side door which is adjustable by an electric motor or a boot lid of a motor vehicle which is adjustable by an electric motor. The capacitive component is in this case formed, for example, by a sensor electrode in order to be able to detect an operation event contactlessly hereby. Thus, the measurable capacitance changes owing to a body part of a user in the region of the sensor electrode, with the result that a user can initiate an operation event in a targeted manner by the respective body part, which operation event is detected via the sensor electrode and should result in automatic adjustment of the respective closing element. An exemplary application in this case is the application of a sensor electrode in the region of a rear bumper of a motor vehicle in order to identify, via the sensor electrode, a movement of a foot of a user in the region of the bumper in the manner of a kick as an operation event and to open the tailgate or the boot lid of the motor vehicle in response to this. The adjustment of the closing element in the form of the tailgate or the boot lid can therefore be controlled contactlessly, i.e. without the respective closing element being touched by the user.

DE 10 2006 029 120 A1 proposes a conversion device having a constant current source and an integrator in the form of a capacitor. In this case, the switching-on and switching-off of the constant current source or the connection thereof to the integrator is controlled via the output signal of the monostable flipflop. Depending on the duration of the output signal, which is in turn dependent on the capacitance of the capacitive component, a signal voltage is thus integrated at the integrator by the constant current source, i.e. the integrator is charged in the form of a capacitor. The signal voltage which is measurable via the integrator is evaluated by an electronic evaluation unit in order to draw a conclusion in respect of the presence of an operation event, for example when a threshold value is exceeded, and to generate a tripping signal. The adjustment of a closing element of a motor vehicle would then be controllable via such a tripping signal, for example.

The provision of a constant current source and the targeted switching thereof on the basis of the output signal provided by the monostable flipflop, for example via a switch to be provided in the circuit arrangement, can under certain circumstances be only comparatively complex to implement in terms of circuitry, however.

DE 102 58 417 B3 again describes a circuit arrangement for detecting and/or determining the properties of a medium with the aid of a capacitive component in the form of a pair of electrodes, in which a conclusion is drawn in respect of a composition of a medium into which the two electrodes are immersed on the basis of the capacitance measurable via the two electrodes. For this purpose, the two electrodes are connected to a monostable flipflop, referred to as monostable multivibrator in DE 102 58 417 B3, which generates an output signal with a specific duration depending on the capacitance at the electrodes. This output signal is passed via a low-pass filter connected downstream of the monostable flipflop in order thereafter to provide a signal voltage which is evaluated by an evaluation unit. In this case, for example, the content of water in the respective medium can be determined on the basis of the value of the signal voltage, and it is possible to distinguish between different media, such as, for example, diesel fuel, biodiesel fuel and water on the basis of their different dielectric constants.

In the circuit arrangement from DE 102 58 417, however, it is disadvantageous when using an RC low-pass filter that the signal voltage which can be tapped off at a capacitor of the low-pass filter only has a temporarily linear course over time, to be precise only for as long as an input voltage present at the low-pass filter is considerably lower than the output voltage which can be measured at the output of the low-pass filter. The output voltage has an e function over time in the case of an RC low-pass filter and therefore asymptotically approaches a maximum value. Precisely in order to detect whether an operation event for adjusting a closing element of a vehicle is present, however, a linear relationship between the capacitance of the capacitive component and the signal voltage also over relatively long time periods is preferred in order to be able to therefore safely identify the respective, possibly complex operation event.

SUMMARY

The present invention is therefore based on the object of further improving a circuit arrangement of the generic type and providing an improved method for detecting a capacitance and/or a change in capacitance of a capacitive component.

In a circuit arrangement according to the invention, the following is correspondingly provided:

a monostable flipflop controllable by a control signal and having at least two inputs and one output, wherein a first input of the monostable flipflop is provided for the control signal, a second input is connected to a capacitive component, and an output signal is generated at the output of the monostable flipflop on actuation, the duration of said output signal being dependent on the capacitance of the capacitive component, a conversion device, which is connected to the output of the monostable flipflop and is formed with an integrator having an operational amplifier and is intended to convert an output signal generated at the output of the monostable flipflop into a signal voltage whose course is proportional to the duration of the output signal and which changes linearly over time, an evaluation unit, which is connected to the integrator of the conversion device in order to evaluate the signal voltage and from this to generate at least one detection value, which indicates the capacitance and/or a change in the capacitance of the capacitive component, and the magnitude of the signal voltage is controllable and/or a characteristic for the signal voltage is variable via a switchable setting device.

Owing to the use of an integrator with an operational amplifier and with at least one capacitor connected in parallel therewith, a signal voltage with a linear course is generated at the output of the integrator to which the evaluation unit is connected, which signal voltage is directly dependent on the output signal of the monostable flipflop and therefore on the capacitance of the capacitive component. As a result, the integrator is designed in accordance with the invention and connected between the output of the monostable flipflop and the evaluation unit in such a way that an output signal of the monostable flipflop is present at an amplifier input of the operational amplifier and results in a signal voltage which changes linearly over time, wherein the values which can be assumed by the signal voltage are directly dependent on the output signal and are preset by the output signal.

In contrast to the circuit arrangement in DE 10 2006 069 120 A1, therefore, no switching element which is switchable via the output signal of the flipflop is provided between the monostable flipflop and the conversion device, but rather the output signal is supplied directly to the operational amplifier of the integrator in order hereby to generate the signal voltage. Furthermore, in the solution according to the invention, there is also no switching of a constant current source by the output signal in order then to generate a signal voltage independently of the voltage value of the output signal with the aid of the constant current source at an integrator. The solution according to the invention is instead based on the basic concept of further developing directly the output signal of the monostable flipflop and preferably also presetting the values which the signal voltage can assume via the voltage values of said output signal.

Correspondingly, in a preferred variant embodiment, provision is made for the monostable flipflop to be designed in such a way that its output signal can assume two discrete voltage values. For example, the voltage value of the output signal varies between 0 V and a positive voltage value, for example of the order of 5 V, 10 V or 15 V.

The magnitude of the signal voltage in the circuit arrangement with an operational amplifier according to the invention is controllable, preferably via an electronic setting device, which is independent of the output signal, continuously or in predefined stages. In this way, for example, a gain preset by the integrator can be settable. If required and depending on the intended use, the desired sensitivity, the response threshold and/or environmental conditions, a gain between the output signal and the signal voltage can thus be adapted and a characteristic (curve) for the signal voltage to be evaluated can be changed.

In one variant embodiment, the current fed back at an input of the operational amplifier is changed with the aid of an electronic setting device for this purpose. As a result, the rate of rise of a characteristic for the signal voltage can be changed in a targeted manner easily, in particular the characteristic curve can be tilted.

In one exemplary embodiment, a switchable setting device is provided via which a plurality of discrete values for the gain are preset and selectable. In this case, different gains can be preset via different switching states of the setting device. In one possible exemplary embodiment, a changed gain can also effect a change in the magnitude of the signal voltage, in particular a change in a possible maximum value of the signal voltage which is directly dependent on the output signal and hereby in turn an adaptation of a characteristic for the signal voltage. For example, a setting device has at least one switching means in the form of a field-effect transistor, preferably at least two field-effect transistors, in order to be able to assume, controlled electrically, different switching states.

Furthermore, it is preferred if the output signal of the monostable flipflop is present at an amplifier input of the operational amplifier and the output signal, which preferably varies between a minimum value and a maximum value, has a minimum value, which is less than a voltage value of a reference voltage which is present at the other amplifier input of the operational amplifier, and has a maximum value, which is greater than the voltage value of the reference voltage at the other amplifier input.

In this case, an output signal can therefore map two different states and can therefore preset two different voltages at an amplifier input of the operational amplifier, of which one voltage is below the reference voltage present at the other amplifier input and the other voltage is above this reference voltage. In this configuration, a linearly rising or linearly falling voltage signal is generated by a capacitor, which is connected in parallel with the operational amplifier and which is connected firstly to the amplifier input at which the output signal is present and secondly is connected to the output of the operational amplifier at the output of the operational amplifier depending on whether the voltage of the output signal is above or below the reference voltage. As a result, a conclusion in respect of the capacitance of the capacitive component is possible particularly simply and effectively. Since the duration of the output signal with a specific voltage value is directly dependent on the capacitance of the capacitive component, the duration of the linear rise or fall of the signal voltage is also always directly dependent on the capacitance of the capacitive component.

With a view to a circuit arrangement which is as economical as possible, it is preferred that for operation of the operational amplifier, a supply voltage is provided and the circuit arrangement has a voltage divider in order to provide a reference voltage which is present at an amplifier input of the operational amplifier as a partial voltage of the supply voltage. Therefore, the supply voltage can be applied at one point in the circuit arrangement and not only a supply connection of the operational amplifier can be connected thereto, but also one of the amplifier inputs of the operational amplifier via a voltage divider. As is generally known, such a voltage divider is preferably formed by two resistors.

In a preferred variant embodiment, the integrator, defined by the operational amplifier, of a circuit arrangement according to the invention is inverting. Correspondingly, the output signal is in this case present at the inverting (negative) amplifier input of the operational amplifier and the reference voltage is present at the noninverting (positive) amplifier input. However, it is of course possible also to use a noninverting integrator, as a result of which, for example, in the case of constant output signals varying between two voltage values, only linear courses result for the signal voltage, which linear courses are inverse to the courses of the signal voltage in the case of an inverting integrator.

With a view to the evaluation of the signal voltage generated, it is preferred in one exemplary embodiment that a peak value holding element is connected downstream of the integrator in order to store a maximum voltage value for the signal voltage (for the control signal just given to the monostable flipflop). The maximum voltage value held or stored can then be compared, for example, with a threshold value for the signal voltage stored in the evaluation unit in order to evaluate whether this threshold value has been undershot or exceeded.

If it is established that the threshold value has been exceeded or undershot, the evaluation unit can generate, for example, a tripping signal in order to signal that the capacitance of the capacitive component has undershot or exceeded a capacitance value classified as relevant or a corresponding change in capacitance has occurred. Such a tripping signal can indicate, for example, the presence of an operation event for adjusting a closing element on a vehicle.

The maximum voltage value that is stored at the peak value holding element may therefore be a detection value which indicates the capacitance and/or a change in the capacitance of the capacitive component, with the result that the peak value holding element in this case represents part of an (electronic) evaluation unit. As an alternative or in addition, it is of course also possible for the signal voltage to be transmitted directly to an electronic evaluation unit. In this case, the evaluation unit is capable, for example, of obtaining one detection value or a plurality of detection values on the basis of the signal course, in particular for example on the basis of the duration of a linear rise or fall in the signal voltage up to a threshold value or even a plurality of threshold values being exceeded and/or undershot. A detection value can indicate to a downstream control device, for example, a capacitance of the capacitive component and/or a change in capacitance. Thus, the detection value can also be a value which is generated by the evaluation unit in order to indicate a specific capacitance value and/or a change in capacitance value in the capacitive component qualitatively or quantitatively.

In an exemplary circuit arrangement, the peak value holding element, which is connected to the output of the integrator, comprises at least one diode and one storage capacitor. It is of course possible for the maximum voltage value held at the peak value holding element to not be identical to a maximum value of the signal voltage generated at the output of the integrator. Thus, for example, additional resistors can also be provided in the circuit arrangement so that the voltage held at the storage capacitor of the peak value holding element with the aid of the diode is less than the signal voltage generated at the output of the integrator. The voltage present at the storage capacitor of the peak value holding element is in any case proportional to the signal voltage, however.

As already explained at the outset, a further aspect of the present invention consists in providing a circuit arrangement according to the invention in an adjusting device for an adjustable closing element of a vehicle.

In the case of such an adjusting device, a vehicle body opening of a vehicle is closable via the closing element, and the closing element can be adjustable automatically in order to clear the vehicle body opening in the case of the presence of an operation event. As an alternative or in addition, in the event of the presence of an operation event, locking of the closing element can be actuable in order to release the closing element and to be able to adjust (manually or actuated by external force) the closing element at all. For example, the closing element is a tailgate or a (side) door of a motor vehicle or a boot lid of a motor vehicle. In this case, the presence of an operation event is identified via a capacitively operating sensor device having at least one capacitive component, for example in the form of a single sensor electrode or at least one pair of sensor electrodes, on the basis of the capacitance of the component and/or a change in the capacitance of the component.

A further aspect of the present invention consists in a method for detecting a capacitance and/or a change in the capacitance of a capacitive component, in which at least the following steps are provided:

controlling a monostable flipflop by applying a control signal, which is provided by an electronic control unit, for example, to a first input of the monostable flipflop, wherein the monostable flipflop is connected to the capacitive component at a second input, generating at least one output signal at an output of the monostable flipflop in the case of the application of the control signal, wherein the duration of the output signal generated is dependent on the capacitance of the capacitive component, and converting the at least one output signal into a signal voltage whose course is proportional to the duration of the output signal.

In analogy to a circuit arrangement according to the invention, in a method according to the invention provision is made for the conversion of the output signal to take place by means of an integrator, which has an operational amplifier, which has the output signal present at an amplifier input thereof, and which converts the output signal of the monostable flipflop to give a signal voltage which changes linearly over time, with the result that the values which can be assumed by the signal voltage are preset by the output signal. According to the invention there is further provided a possibility for control of the magnitude of the signal voltage and/or for variation of a characteristic for the signal voltage via a switchable setting device, such that for example, a gain between the output signal and the signal voltage preset by the integrator can be settable continuously or in predefined stages, if required and depending on the intended use, the desired sensitivity, the response threshold and/or environmental conditions, thus the gain can be adapted in a targeted manner easily and a characteristic for the signal voltage to be evaluated can be changed.

It is therefore obvious that the advantages and features of exemplary embodiments of a circuit arrangement explained above and yet to be explained below also apply to a method for detecting a capacitance and/or a change in the capacitance of a capacitive component, and vice-versa.

BRIEF DESCRIPTION OF THE DRAWINGS

In the description below relating to an exemplary embodiment on the basis of the figures, further advantages and features of the present invention will become clear.

DETAILED DESCRIPTION

Figure 3:
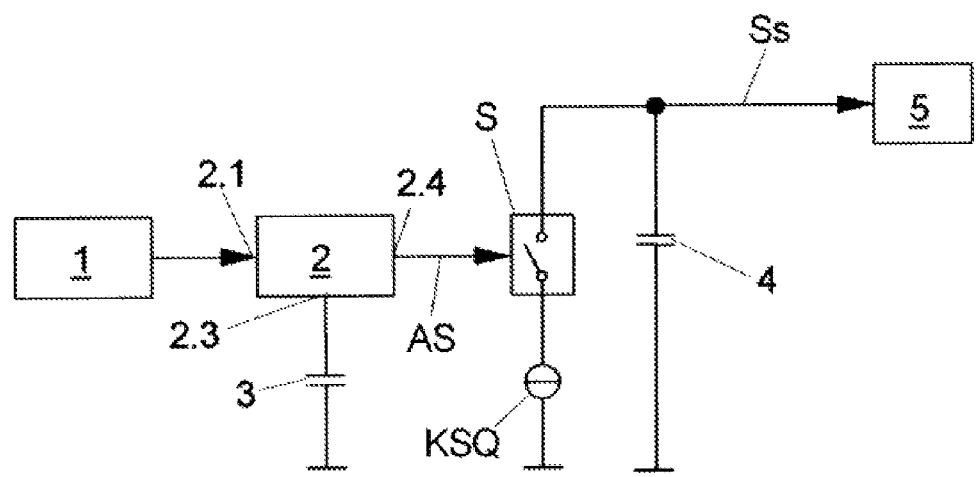
FIG. 3 shows a circuit arrangement known from the prior art.

With initial reference being made to FIG. 3, an exemplary embodiment previously known from DE 10 2006 029 120 A1 of a circuit arrangement in accordance with the generic type is illustrated, in which a conversion device having a switch S, a constant current source KSQ and an integrator 4 is provided.

In the exemplary embodiment known from the prior art of a circuit arrangement as shown in FIG. 3, a control signal is generated by an electronic control unit 1 and is transmitted to a monostable flipflop 2. For this purpose, the control unit 1 is connected to a first input 2.1 of the flipflop 2. The monostable flipflop 2 is connected to a capacitive component 3 at a second input 2.3. This capacitive component is in this case shown in the form of a sensor capacitance 3 and can be, for example, a sensor electrode of a capacitive proximity switch or comprise a sensor capacitor comprising a response electrode and a reference electrode.

At least one output signal AS is generated by means of the monostable flipflop 2 at an output 2.4 of the flipflop 2 as a result of a control signal from the control unit 1, the duration of said output signal being dependent on the capacitance or the magnitude of the sensor capacitance 3. This output signal AS is used in the circuit arrangement known from the prior art for controlling a switch S in order to connect a constant current source KSQ for the duration of the output signal to an integrator 4 in the form of a capacitor. The integrator 4 is charged via the constant current source KSQ, wherein the voltage integrated via the integrator 4 is evaluated as a signal voltage Ss by an electronic evaluation unit 5. The signal voltage Ss is proportional to the duration of the output signal AS and has a linear course over time owing to the constant current source KSQ. The signal voltage Ss is therefore representative of the magnitude of the sensor capacitance 3 or the capacitance and/or a change in the capacitance of a sensor capacitor formed thereby. After completion of a measurement, in each case a discharge operation is provided.

The evaluation unit 5 can therefore form a detection value from the signal voltage Ss, which detection value indicates the magnitude of the sensor capacitance 3 quantitatively and/or the change in the sensor capacitance 3 qualitatively. At least one threshold value is stored in the evaluation unit 5, for example, and when this threshold value is exceeded or undershot by the signal voltage Ss, the generation of a tripping signal is initiated. Such a tripping signal could indicate the presence of an operation event, followed by an adjustment of a closing element of a vehicle which is actuated by external force, i.e. in particular driven via a drive motor. For example, in the case of the presence of a specific operation event sensed by the sensor capacitance 3, opening or closing of a tailgate or a side door and/or a boot lid of a motor vehicle can be triggered.

Instead of connecting the constant current source KSQ to the integrator 4 via the switch S selectively depending on the trigger signal AS, provision can also alternatively be made for the constant current source KSQ to be switched on and off directly via the trigger signal AS.

The circuit arrangement known from DE 10 2006 029 120 A1 as shown in FIG. 3 comprising a switching element controllable by the trigger signal AS, for example the switch S and the generation of a signal voltage Ss, which is independent of the magnitude of a voltage provided by the output signal AS of the monostable flipflop 2, can be realized in a comparatively complex manner in terms of circuitry, under certain circumstances, in particular with a view to providing a constant current source KSQ.

With the solution according to the invention, an improved circuit arrangement and an improved method for detecting a capacitance and/or a change in the capacitance of a capacitive component such as the sensor capacitance 3 are provided.

Figure 1:
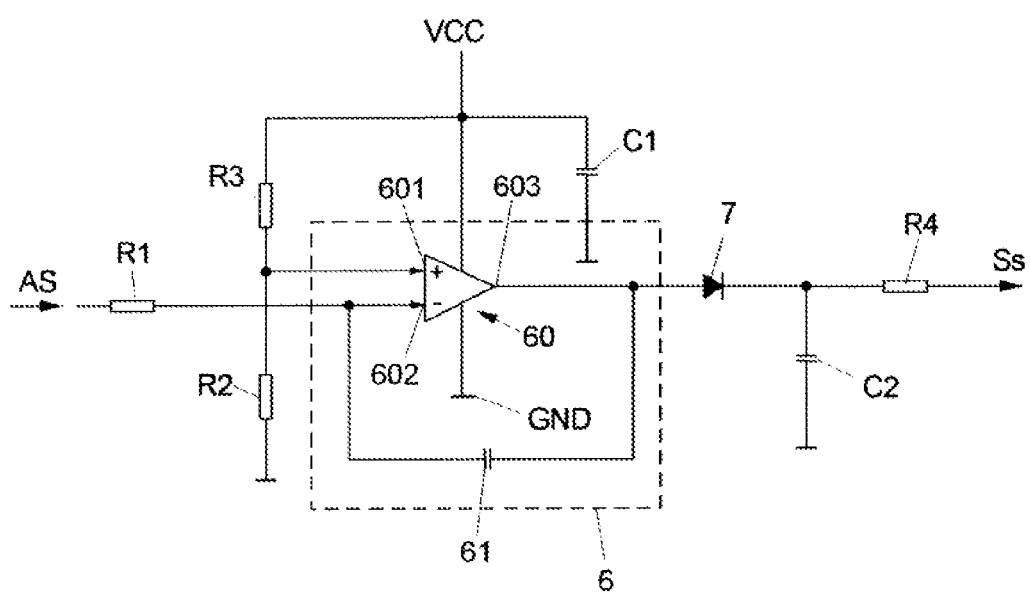
FIG. 1 shows a detail of an exemplary embodiment of a circuit arrangement having an inverting integrator having an operational amplifier and a peak value holding element.

FIG. 1 shows a circuit arrangement according to the invention, in which a conversion device for converting the output signal AS of the monostable flipflop 2 into a signal voltage Ss for the evaluation unit 5 comprises an inverting integrator 6 having an operational amplifier 60. The values which can be assumed by the signal voltage Ss in this circuit arrangement are preset directly by the output signal AS.

The output signal AS is in this case provided via a resistor R1 directly at an inverting (negative) amplifier input 602 of the operational amplifier 60. A reference voltage is present at the other, noninverting (positive) amplifier input 601 of the operational amplifier 60, which reference voltage results as partial voltage of a supply voltage VCC. For this purpose, a voltage divider formed by two series-connected resistors R2 and R3 is provided, by means of which only a fraction of the supply voltage VCC, for example ½ VCC, is applied at the noninverting amplifier input 601. The supply voltage VCC which is specified with respect to ground GND furthermore also is used for the supply to the operational amplifier 60 and is therefore connected to the supply connection thereof. In addition, a storage capacitor C1 is provided, which is connected to the supply voltage VCC with respect to ground GND. Stabilization of the operating voltage, in particular for the operational amplifier 60, is achieved via this optional storage capacitor C1.

In addition, a capacitance 61 is connected in parallel with the operational amplifier 60 in a manner known per se and for this purpose is connected both to an output 603 of the operational amplifier 60 and to the inverting amplifier input 602, at which the output signal AS is present.

The monostable flipflop 2 is embodied in this case such that, as a result of a control signal at its first input 2.1, an output signal AS with a maximum (constant) voltage value >0 V, for example 5 V, is generated. Depending on the magnitude of the sensor capacitance 3, this output signal AS is present with its maximum value (high level) for a specific duration at the inverting amplifier input 602. The reference voltage at the noninverting amplifier input 601 is now selected such that it is less than the maximum voltage value of the output signal AS, for example approximately half the maximum value of the output signal AS, i.e. for example 2.5 V. Correspondingly, a signal voltage Ss which falls linearly over time and which can fall to 0 V, depending on how long the output signal AS with the maximum voltage value is present, is generated at the amplifier output 603.

The output signal As can also assume, in addition to its maximum value, a discrete minimum value (low level), the duration of which is likewise dependent on the magnitude of the sensor capacitance 3. This minimum value is in this case 0 V, with the result that there is therefore a lower voltage present at the inverting amplifier input 602 than at the noninverting amplifier input 601, at which the constant reference voltage, which is greater than the minimum value of the output signal AS (>0 V) and at the same time less than the maximum value of the output signal AS (<5 V) is always present. In this case, therefore, 0 V<$V_{Reference}$<5 V applies for a reference voltage $V_{Reference}$, for example.

With this configuration, a signal voltage Ss which rises linearly over time and which has a duration which is likewise directly proportional to the duration of the output signal AS with the minimum value and therefore dependent on the magnitude of the sensor capacitance 3, is generated at the amplifier output 603. On the basis of the signal voltage Ss generated in such a way via the integrator 6 with the operational amplifier 60, therefore, a conclusion can be drawn by the evaluation unit 5 directly on the magnitude of the sensor capacitance 3 and/or a change in a sensor capacitance 3 qualitatively and/or quantitatively.

In the present case, use is made of the output signal AS with the minimum value of in this case 0 V and the linearly rising signal voltage Ss resulting therefrom in order to draw a conclusion in respect of the presence of a specific operation event. In this case, the presence of a specific operation event is detected when the signal voltage Ss has sufficient time to rise beyond a threshold value. The output signal AS of the monostable flipflop 2 with the minimum (constant) voltage value of 0 V is therefore in this case present at the operational amplifier 60 as long as the signal voltage Ss generated at the amplifier output 603 rises linearly beyond a response threshold defined by the threshold value, which is assessed as indicating the presence of an operation event. As a consequence of the detection of this operation event, in this case preferably a trigger signal is generated by the evaluation unit 5 in order to open or close, actuated by external force, a closing element (not illustrated), such as a tailgate or a boot lid of a motor vehicle, for example. A change in a capacitance value which is representative of the presence of an operation event, which change is detected via the sensor capacitance 3, can in this case have been brought about, for example, by a body part of a user coming close to the sensor capacitance 3.

In order to be able to effectively evaluate the linear rise in the signal voltage Ss in the circuit arrangement in FIG. 1, a peak value holding element is provided, which in this case is formed by a diode 7 and a storage capacitor C2 and a series-connected resistor R4. The storage capacitor C2 is charged by the signal voltage Ss, wherein the diode 7 connected between the amplifier output 603 and the storage capacitor C2 prevents the storage capacitor C2 from discharging via the operational amplifier 60. The storage capacitor C2 is charged proportionally to the signal voltage Ss generated at the amplifier output 603 and maintains a maximum voltage value reached since discharge is prevented by the diode 7. The signal voltage measurable via the storage capacitor C2 therefore always represents a maximum value, which is representative of the maximum reached signal voltage Ss. The voltage held or stored at the storage capacitor C2 can therefore be evaluated and compared with at least one threshold value stored in the evaluation unit 5, with it being assumed that an operation event is present when said threshold value is exceeded.

With the circuit arrangement shown in FIG. 1, a particularly simple possibility for detecting a capacitance and/or a change in capacitance of a capacitive component, such as the sensor capacitance 3, is possible, wherein in this case directly the voltage values of an output signal AS generated by the monostable flipflop 2 preset the minimum and maximum achievable voltage values of a signal voltage Ss obtained therefrom and, in addition, a linear course of the signal voltage Ss resulting from the output voltage AS is achieved.

Figure 2:
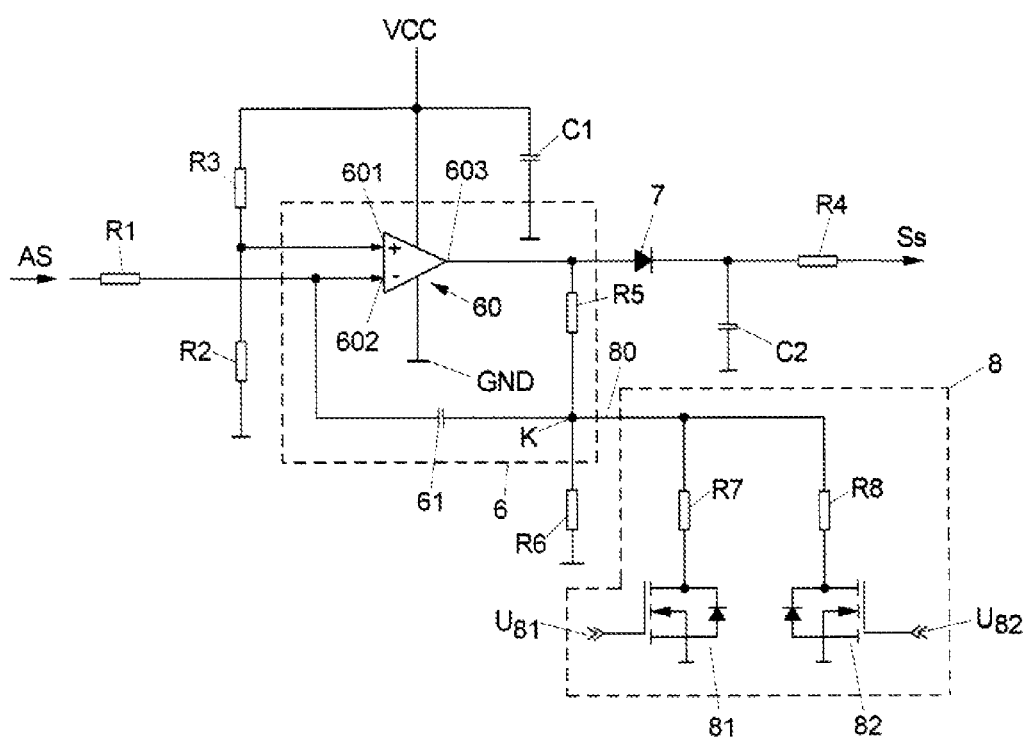
FIG. 2 shows a development according to the invention of the exemplary embodiment shown in FIG. 1 with a setting device for presetting different gains at the integrator.

FIG. 2 illustrates a development according to the invention of the circuit arrangement illustrated in FIG. 1, in which a gain of the integrator 6 is settable and variable. In this case, by varying the gain, a characteristic of the signal voltage Ss can be matched, i.e. in this case the rate of rise thereof can be matched.

The circuit arrangement in FIG. 1 is in this case supplemented at the output of the operational amplifier 60 by a voltage divider comprising resistors R5 and R6 and a setting device 8, with which, variably, resistors R7 and R8 can be connected in parallel with one resistor R6. Therefore, the potential at a node K can be shifted via the setting device 8, which node is between the resistors R5 and R6, with a line to the capacitance 61 of the integrator 6 and a connection line 80 of the setting device 8 being connected to said node. The current fed back to the operational amplifier 60 can be varied in this way depending on the total resistance which is connected in series with the resistor R5.

The setting device 8 can in this case assume a plurality of different switching states, in which in each case a different total resistance is connected in series with the resistor R5. The different switching states are in this case preset via two MOSFETs 81 and 82 (MOSFET=metal-oxide semiconductor field-effect transistor). The current flowing via the respectively assigned resistor R7 or R8 can be controlled by the gate-source or control voltage $U_{81}$ or $U_{82}$ applied to the respective MOSFET 81 and 82, as a result of which the total resistance connected in series with the resistor R5 is variable and controllable in a targeted manner in terms of its magnitude. As a result, a maximum value for the signal voltage Ss can be varied in a simple manner, for example stepped up or stepped down between 2.5 V and 3.5 V, and therefore the rate of rise of the signal voltage Ss can be matched. A switching state of the setting device 8 is in this case, in contrast to the signal voltage Ss, not directly dependent on the output signal AS, but independent thereof and freely selectable depending on requirements and in particular the (present) intended use or environmental conditions of the circuit arrangement.

The MOSFETs 81 and 82 in the exemplary embodiment in FIG. 2 are operated via the control voltages $U_{81}$ and $U_{82}$ in such a way that the setting device 8 can assume four discrete switching states. In the respective switching state, both, only one or none of the MOSFETs 81 and 82 are switched so as to be active.

Although an inverting integrator 6 is provided in the exemplary embodiments in FIGS. 1 and 2, it is of course possible to use a noninverting integrator instead. In this case, the evaluation logic stored in the evaluation unit 5 would then be matched, i.e. likewise inverted, of course.

LIST OF REFERENCE SYMBOLS

1 Control unit
2 Flipflop
2.1, 2.3 Input
2.4 Output

3 Sensor capacitance
4 Integrator
5 Evaluation unit
6 Integrator
60 Operational amplifier
601, 602 Amplifier input
603 Amplifier output
61 Capacitance
7 Diode
8 Setting device
80 Connection line
81, 82 MOSFET (field-effect transistor)
AS Output signal
C1 Storage capacitor
C2 Storage capacitor
GND Ground
K Node
KSQ Constant current source
R1-R8 Resistor
S Switch
Ss Signal voltage
$U_{81}$, $U_{82}$ Control voltage
VCC Supply voltage

The invention claimed is:

1. A circuit arrangement for detecting a capacitance of a capacitive component and/or a change in the capacitance of a capacitive component, the circuit arrangement comprising:
   a monostable flipflop controllable by a control signal and having at least two inputs and one output, wherein a first input of the flipflop is provided for the control signal,
   a capacitive component which is connected to a second input of the monostable flipflop,
   a conversion device which is connected to the output of the monostable flipflop and is configured to convert an output signal generated at the output into a signal voltage, and
   an evaluation unit which is connected to the conversion device in order to evaluate the signal voltage and to generate at least one detection value based on the signal voltage and which indicates the capacitance and/or a change in the capacitance of the capacitive component,
   wherein the monostable flipflop is configured to generate at least one output signal at its output on actuation by the control signal, the duration of said output signal being dependent on the capacitance of the capacitive component, and wherein the conversion device converts the at least one output signal into a signal voltage whose course is proportional to a duration of the output signal,
   wherein the conversion device comprises an integrator having an operational amplifier, wherein the integrator is connected between the output of the monostable flipflop and the evaluation unit and configured such that an output signal of the monostable flipflop is present at an amplifier input of the operational amplifier and results in a signal voltage which changes linearly over time, wherein the values which can be assumed by the signal voltage are preset by the output signal and dependent directly from the output signal, and
   wherein a magnitude of the signal voltage is controllable and/or a characteristic for the signal voltage is variable via a switchable setting device whose switching state is independent from the output signal, the magnitude of the signal voltage being controllable and/or the characteristic for the signal voltage being variable by setting a gain of the integrator between the output signal generated at the output of the monostable flipflop and the signal voltage generated via the conversion device, wherein a plurality of discrete values for the gain are preset and selectable via the switchable setting device.

2. The circuit arrangement according to claim 1, wherein the setting device is provided at an output of the operational amplifier and a current fed back to the operational amplifier can be varied by the setting device.

3. The circuit arrangement according to claim 1, wherein the setting device has at least one field-effect transistor for controlling the magnitude of the signal voltage and/or a change in the signal voltage.

4. The circuit arrangement according to claim 1, wherein the monostable flipflop is configured such that its output signal can assume two discrete voltage values.

5. The circuit arrangement according to claim 1, wherein the output signal of the monostable flipflop:
   has a minimum value which is less than a voltage value of a reference voltage which is present at the other amplifier input of the operational amplifier, and
   has a maximum value which is greater than the voltage value of the reference voltage at the other amplifier input.

6. The circuit arrangement according to claim 1, wherein, for operation of the operational amplifier, a supply voltage is provided and wherein the circuit arrangement has a voltage divider in order to provide a reference voltage which is present at an amplifier input of the operational amplifier as a partial voltage of the supply voltage.

7. The circuit arrangement according to claim 1, wherein the integrator is inverting.

8. The circuit arrangement according to claim 1, wherein a peak value holding element is connected downstream of the integrator in order to store a maximum voltage value of the signal voltage.

9. The circuit arrangement according to claim 8, wherein the peak value holding element comprises at least one diode and one storage capacitor.

10. The circuit arrangement according to claim 1, wherein at least one threshold value for the signal voltage is stored in the evaluation unit, and wherein the evaluation unit is configured to generate a tripping signal if this threshold value is exceeded or not reached by the signal voltage.

11. A method for detecting a capacitance of a capacitive component and/or a change in the capacitance of a capacitive component, said method comprising:
   controlling a monostable flipflop by applying a control signal to a first input of the monostable flipflop, wherein the monostable flipflop is connected to the capacitive component at a second input,
   generating at least one output signal at an output of the monostable flipflop upon application of the control signal, wherein the duration of the output signal generated is dependent on the capacitance of the capacitive component, and
   converting the at least one output signal into a signal voltage whose course is proportional to the duration of the output signal,
   wherein the output signal is converted by an integrator which has an operational amplifier, the amplifier having the output signal present at an amplifier input thereof and which converts the output signal of the monostable flipflop into a signal voltage which changes linearly over time so that values which can be assumed by the signal voltage are preset by the output signal and dependent directly from the output signal, and wherein the magnitude of the signal voltage is controllable and/or a characteristic for the signal voltage is variable via a switchable setting device whose switching state is independent from the output signal, the magnitude of the signal voltage being controllable and/or the characteristic for the signal voltage being variable by setting a gain of the integrator between the output signal generated at the output of the monostable flipflop and the signal voltage generated via the conversion device, wherein a plurality of discrete values for the gain are preset and selectable via a switchable setting device.

\* \* \* \* \*